(12) United States Patent
Li et al.

(10) Patent No.: US 11,365,481 B2
(45) Date of Patent: Jun. 21, 2022

(54) HOMOGENEOUS AND TRANSPARENT PROTECTIVE COATINGS FOR PRECIOUS METALS AND COPPER ALLOYS

(71) Applicant: City University of Hong Kong, Kowloon (HK)

(72) Inventors: Kwok Yan Li, Kowloon (HK); Zhifeng Zhou, New Territories (HK); Po Wan Shum, Tai Po (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 743 days.

(21) Appl. No.: 14/876,156

(22) Filed: Oct. 6, 2015

(65) Prior Publication Data

US 2017/0096739 A1   Apr. 6, 2017

(51) Int. Cl.
| | |
|---|---|
| *C23C 16/44* | (2006.01) |
| *C23C 16/513* | (2006.01) |
| *C23C 16/455* | (2006.01) |
| *C23C 16/509* | (2006.01) |
| *C23C 16/505* | (2006.01) |

(52) U.S. Cl.
CPC ........ *C23C 16/513* (2013.01); *C23C 16/4401* (2013.01); *C23C 16/4409* (2013.01); *C23C 16/455* (2013.01); *C23C 16/45523* (2013.01); *C23C 16/45559* (2013.01); *C23C 16/505* (2013.01); *C23C 16/5096* (2013.01); *Y10T 428/24545* (2015.01); *Y10T 428/24628* (2015.01)

(58) Field of Classification Search
CPC ..... C23C 16/513; C23C 16/455; C23C 16/44; Y10T 428/24545; Y10T 428/24628
See application file for complete search history.

(56) References Cited

U.S. PATENT DOCUMENTS

| | | | | |
|---|---|---|---|---|
| 4,517,217 | A | * 5/1985 | Hoffman | ............... A44C 27/005 204/192.16 |
| 2004/0083759 | A1* | 5/2004 | Starcke | ................... A44C 17/00 63/32 |

(Continued)

FOREIGN PATENT DOCUMENTS

| | | |
|---|---|---|
| CN | 101028149 A | 9/2007 |
| CN | 101379215 A | 3/2009 |

(Continued)

OTHER PUBLICATIONS

Martinu et al., Handbook of Deposition Technologies for Films and Coatings, 2010 (Year: 2010).*

(Continued)

*Primary Examiner* — Tong Guo
(74) *Attorney, Agent, or Firm* — Amin, Turocy & Watson, LLP (57) ABSTRACT

Homogeneous and transparent protective coatings for precious metals and copper alloys and techniques for forming the coatings on precious metals and copper alloys are provided. In an embodiment, ionic oxide film is deposited onto a surface of a substrate including a metal, such as a precious metal and/or a copper alloy, using pulsed chemical vapor deposition (PCVD). A homogenous and transparent solid film based on ionic oxide is formed on the surface of the substrate in response to the depositing.

15 Claims, 8 Drawing Sheets

(56) References Cited

U.S. PATENT DOCUMENTS

| | | | |
|---|---|---|---|
| 2008/0317972 A1* | 12/2008 | Hendriks | C23C 16/401 427/569 |
| 2009/0004386 A1* | 1/2009 | Makela | A44C 27/005 427/255.19 |
| 2011/0065287 A1* | 3/2011 | Wajda | H01L 21/02148 438/785 |
| 2013/0167593 A1* | 7/2013 | Milicevic | C23C 16/045 65/379 |
| 2014/0335272 A1 | 11/2014 | Makela et al. | |

FOREIGN PATENT DOCUMENTS

| | | |
|---|---|---|
| CN | 101445923 A | 6/2009 |
| CN | 101503798 A | 8/2009 |
| CN | 101629285 A | 1/2010 |
| CN | 101705483 A | 5/2010 |
| CN | 103215560 A | 7/2013 |
| CN | 104233235 A | 12/2014 |
| TW | 201529881 A | 8/2015 |
| WO | 2006/097525 A1 | 9/2006 |

OTHER PUBLICATIONS

Robbins et al. Development of tin oxide synthesis by plasma-enhanced chemical vapor deposition, Year 2001.*

G. Dingemans, Plasma-enhanced Chemical Vapor Deposition of Aluminum Oxide Using Ultrashort Precursor Injection Pulses, 2012, Plasma Process. Polym. 2012, 9, 761-771.*

First Office Action received for Chinese Patent Application Serial No. 201610252493.7 dated Aug. 30, 2109, 21 pages (Including English Translation).

* cited by examiner

HOMOGENEOUS AND TRANSPARENT PROTECTIVE COATINGS FOR PRECIOUS METALS AND COPPER ALLOYS

TECHNICAL FIELD

This application generally relates to homogeneous and transparent protective coatings for precious metals and copper alloys.

BACKGROUND

Precious metals and copper alloys are commonly used for decoration in watches, jewelries, souvenirs, coins, etc. For instance, gold (Au) can be added with small amounts of other metals such as copper (Cu), zinc (Zn) and silver (Ag), producing other popular colors like rose gold. As a soft metal, gold can be deformed and worn out easily under external forces. Furthermore, when contacting with chemical substances, moisture, exhaust gases or hand sweat, the gold-plated surface layers can lose their original brightness or color owing to the limited oxidation and corrosion resistance.

Traditional surface protection treatment techniques for precious metals and copper alloy objects, such as electroplating and organic coating, cannot satisfy the stringent requirements of decorative designs. Although physical vapor deposition (PVD) surface protection techniques such as arc evaporation and sputtering are environmental friendly and are successful in the preparation of hard coatings, they possess some intrinsic drawbacks when applied to precious metal and copper alloy based products. For example, some structural defects such as pinholes and droplets are inevitably incorporated into the PVD deposited coatings, deteriorating the surface quality. In addition, PVD coatings are not homogeneous on objects with non-planar surfaces and complex shapes due to the directional nature of the deposited particles (i.e., the shadowing effect).

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

The various embodiments are described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and components are shown in block diagram form in order to facilitate describing the various embodiments.

By way of introduction, the subject matter described in this disclosure relates to homogeneous and transparent protective coatings for precious metals and copper alloys. In various embodiments, a protective film or coating including ionic oxide is synthesized on the surface of an object using a PCVD technique performed at relatively low temperatures (e.g., about 100-300° C.) with precise and dynamic control of gas flows. During deposition, two or more gaseous precursors fill into a vacuum sealed reactor chamber and react on the substrate surface, producing a solid thin film. As the precursors are gas phase molecules, they fill all space independent of substrate geometry and thus do not require line-of-sight to the substrate (as required by PVD). Chemical adsorption of precursors with the substrate surface provides excellent adhesion, and the surface-controlled reaction and growth allow the uniform film deposition. In addition, the PCVD process can be enhanced by plasma, which provides more flexibility to tailor the structure and properties of the deposited films. A PCVD technique that is enhanced by plasma is referred to herein as plasma enhanced PCVD (PE-PCVD). The surface material of the object can vary, however the disclosed coatings and methods for forming the disclosed coating are particularly suited for objects with surfaces including a precious metal and/or copper alloy.

The subject ionic oxide based coatings formed via PCVD increase the hardness of the surface upon which they are formed, thereby substantially improving the wear resistance and endurance of the surface. In addition, the disclosed coatings can prevent surface corrosion and oxidation caused factors such as humidity, chemicals, sea water and sweating. Further, when formed on metal surfaces including a precious metal or copper, the subject transparent coatings conserve the original brightness and luster of the metal surface, or even make the surface appearance more elegant and glossy.

The subject transparent coatings are versatile and can be applied to many industries in which wear resistant surfaces are required. For example, the disclosed coatings can be applied to a variety of products, such as watches, jewelries, molds, lenses, eyeglasses, display devices, biomedical implants, etc. Because the subject coatings are formed via PCVD, the coating material is deposited in a gaseous state, thereby allowing the coating material to uniformly cover the surfaces of the substrate, regardless of the configuration or geometry of the substrate. As a result, the disclosed coatings are especially suited for products with irregular or non-planar surfaces. Further, when applied to products including precious metals, such as jewelry, not only do the subject coatings prevent scratching but the subject coating do not affect the karatage (purity) value of the jewelries after melting.

In accordance with various embodiments, an object is provided that includes a metal surface and a transparent coating or film formed on the metal surface, wherein the transparent coating or film includes and one or more homogenous layers of ionic oxide. In an aspect, the metal surface includes at least one of the following: gold, silver, platinum, palladium, copper, or a copper alloy. The transparent coating or film is configured to protect the metal surface against oxidation, corrosion, and/or discoloration. The one or more homogenous layers can include one or more of the following zinc oxides: aluminum oxide, titanium oxide, a compound comprising aluminum oxide, or a compound comprising titanium oxide.

In one embodiment the transparent coating or film is formed on the metal surface by PCVD of ionic oxide, thereby resulting in formation of the transparent coating or film on the metal surface. In another embodiment, the transparent coating or film is formed on the metal surface by PE-PCVD of ionic oxide, thereby resulting in formation of the transparent coating or film on the metal surface. The PCVD or the PE-PCVD process is performed at a temperature between about 100-300° C. The thickness of the transparent coating or film is substantially uniform over the surface(s) of the object as a result of the PCVD or PE-PCVD. In an aspect, the thickness of the transparent coating or film is between about 10 and 100 nanometers.

In other embodiments a method for forming a transparent protective coating on a substrate is disclosed. The method includes depositing ionic oxide onto a surface of the substrate using PCVD, and forming a homogenous solid ionic oxide film on the surface of the substrate in response to the depositing. In an aspect, the surface of the substrate includes at least one of: gold, silver, platinum, palladium, copper, or a copper alloy. The ionic oxide includes at least one of: aluminum oxide, titanium oxide, a compound comprising aluminum oxide, or a compound comprising titanium oxide. In an aspect, the PCVD is performed at a temperature between about 100-300° C.

In yet another embodiment, another method for forming a transparent protective coating on a substrate is disclosed that includes depositing ionic oxide onto a surface of the substrate using PE-PCVD, and forming a homogenous solid ionic oxide film on the surface of the substrate in response to the depositing. In an aspect, the surface of the substrate includes at least one of: gold, silver, platinum, palladium, copper, or a copper alloy. The ionic oxide includes at least one of: aluminum oxide, titanium oxide, a compound comprising aluminum oxide, or a compound comprising titanium oxide. In an aspect, the PE-PCVD is performed at a temperature between about 100-300° C.

Figure 1:
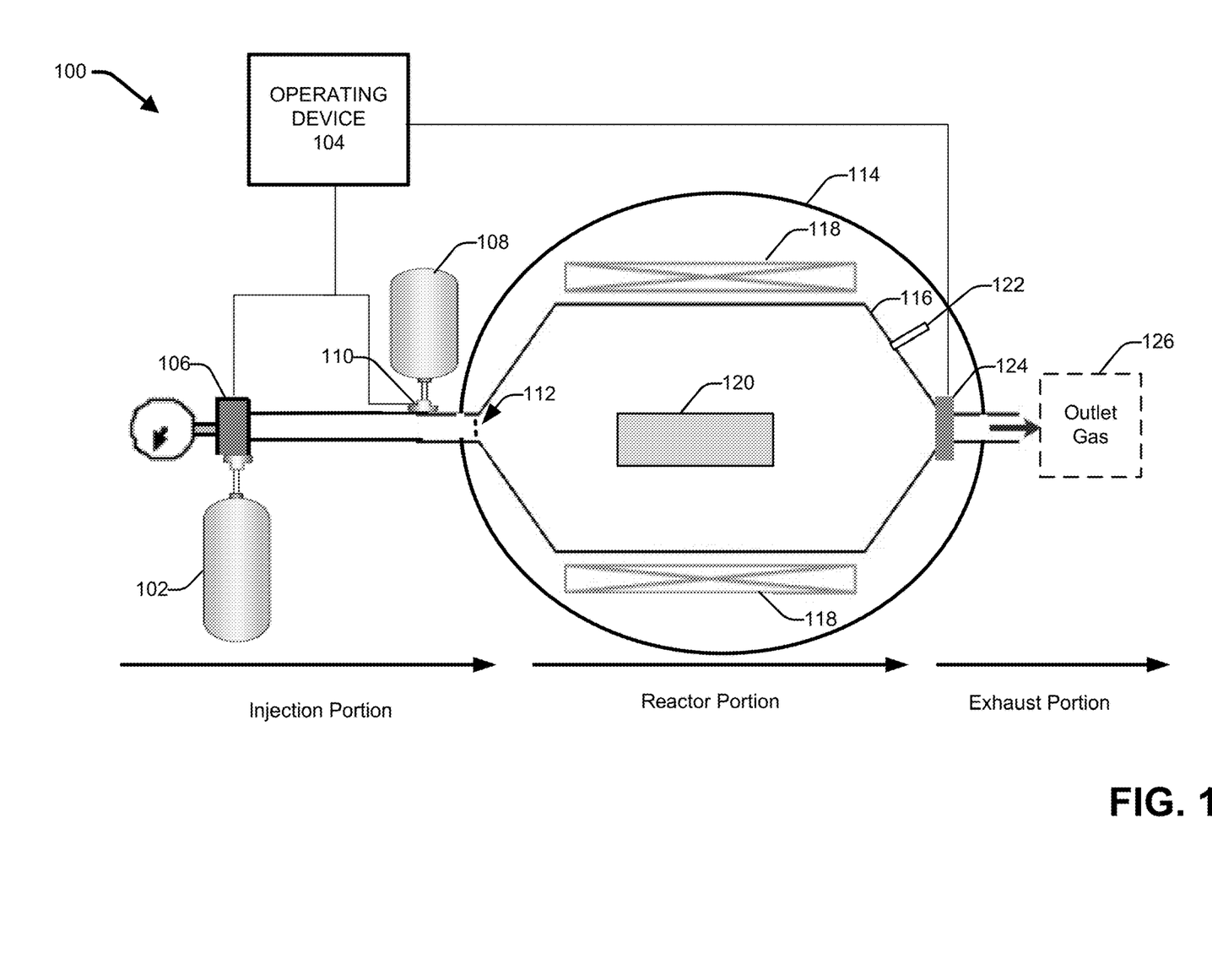
FIG. 1 presents an example pulsed chemical vapor deposition (PCVD) system for applying a homogeneous and transparent protective coating on three-dimensional (3D) metal objects in accordance with various aspects and embodiments described herein.

With reference now to FIG. 1, presented is an example PCVD system 100 for applying a homogeneous and transparent protective coating on 3D metal objects in accordance with various aspects and embodiments described herein.

CVD is a gas phase thin film deposition technique wherein chemical precursors materials are transported to a substrate located within a pressure sealed reactor. The chemical precursors are first converted to a gas phase and transported into the reactor with the thin film being formed on the substrate surface by the reaction of the chemical precursors on or near the substrate surface. Usually heat is used to initiate the chemical reaction(s) between the chemical precursors and the substrate surface resulting in the film formation, however variations to this include chemical activation by exposure to a plasma or microwave radiation.

For example, PECVD utilizes plasma to enhance chemical reaction rates of the CVD precursors. With PECVD, the gas precursors are converted to plasma and the chemical reaction between the precursors and the substrate surface occurs after creation of the plasma. The plasma is generally created by radio frequency (RF) (e.g., at about 13.56 MHz) discharge between two electrodes, the space between which is filled with the reacting gases. PECVD processing allows for thin film deposition at lower temperatures then conventional CVD.

With CVD or PECVD, the reactants are delivered into the reactor volume and transported to the surface of the substrate. The reactants then diffuse through any concentration gradient which may be present, adsorbed onto the substrate surface, nucleate, undergo surface diffusion, and are incorporated into a crystal lattice of the substrate surface. The reaction byproducts then desorb and diffuse away from the substrate and are transported out of the reactor in the exhaust. In certain systems, all or part of the precursor decomposition reaction may occur in the gas phase rather than on the substrate surface.

The subject PCVD and PE-PCVD processes are variant of the conventional CVD and PE-CVD process, respectively. Unlike conventional CVD or PECVD, with the subject PCVD and PE-PCVD techniques the introduction of the gaseous precursor is not carried out continuously, but in timed pulses followed by a pump-down period. The substrate is separately exposed to the gaseous precursor (or precursors) in a series of pulses and purges inside a reaction chamber. PCVD is similar to atomic layer deposition (ALD), but the purge steps are relatively short and the productivity is higher. With this cyclic deposition method, excess reactants in the gas phase are purged out and the reaction takes place only on the substrate surface. Consequently, the undesired reaction and particle formation in the gas phase can be minimized, and lower impurity levels in the films can be obtained.

The subject PCVD and PE-PCVD process have a wide range of operating parameters that can be controlled based on the materials being deposited, the desired properties of the resulting thin film and the substrate material and surface topology. The PCVD process is capable of producing highly uniform and conformal coatings at higher deposition rates, while affording a high degree of microstructural control through varying the reactor operating parameters. The film thickness is determined by the number of cycles used in the deposition process.

System 100 is an example PCVD system for depositing transparent, homogenous thin films of ionic oxide onto the surface of a substrate 120, particularly a substrate having a surface including a precious metal or copper alloy and having a non-uniform/non-planar surface topology. The PCVD system 100 is divided into three sub-control portions, including an injection portion, a reactor portion, and an exhaust portion. In some embodiments, the operating parameters associated with these respective portions can be dynamically controlled via an operating device 104.

The reactor portion includes an internal reaction chamber 116 provided within an external vacuum chamber 114. The external vacuum chamber 114 is a vacuum sealed chamber. Both the internal reaction chamber 116 and external vacuum chamber 114 are made by stainless steel and can be evacuated to a base pressure of about 0.4 Pa by a mechanical pump. The external vacuum chamber wall is water cooled, which protects the internal reaction chamber 116 as well as the heat sources 118 from oxidation during heating and coating processes. The substrate 120 is provided within the internal reaction chamber 116 and the chemical reaction between the gaseous precursors and the substrate takes place only within the internal reaction chamber 116. As a result, no coating is deposited onto the inner wall of the external vacuum chamber 114. After many runs of depositions, the internal reaction chamber 116 can be taken out of the external vacuum chamber 114 for sand blasting and cleaning to remove developed residues, or the internal reaction chamber 116 can be replaced with a new and clean one.

In accordance with the disclosed PCVD processes, the substrate 120 is exposed to one or more gaseous precursors inside the internal reaction chamber 116 by pulse injection of the one or more gaseous (or vaporized) precursors into the internal reaction chamber 116 via an inlet 112. Following each pulse injection period, the un-reacted gaseous precursors are evacuated from the internal reaction chamber 116 (e.g., via the exhaust portion by a mechanical pump with good corrosion and oxidation resistance). In an aspect, the inlet 112 is heated. It should be appreciated that the substrate 120 is depicted as a rectangle merely for ease of explanation and that the size and shape of the substrate 120 can vary. For example, the substrate 120 can include various 3D metal objects with intricate non-planar surface topologies (e.g., jewelry, watches, glasses, goggles, implantable medical devices, displays, etc.).

In some embodiments, heat sources 118 are provided for resistive heating outside the internal reaction chamber 116 (e.g., yet within the external vacuum chamber 114). These heat sources 118 are configured to heat the substrate 120 and/or the gaseous precursors when released into the internal reaction chamber 116. In other embodiments, the heat source(s) 118 can be located within the internal reaction chamber 116. The internal reaction chamber 116 is electrically and thermally isolated from the external vacuum chamber 114 (at ground potential). Consequently, the temperature within the whole internal reaction chamber 116 is distributed homogeneously, and an electrical potential can be applied to the internal reaction chamber 116 when necessary. A Baratron gauge 122 is connected to the internal reaction chamber 116 to facilitate monitoring and/or controlling the pressure of the internal reaction chamber 116 (e.g., by operating device 104).

The injection portion includes a pressure controlled precursor gas source vessel 102 which can include one or more gaseous/vaporized precursors. A precursor gas valve 106 is provided to control the pulsed release of the precursor gas from the precursor gas source vessel 102 into the internal reaction chamber 116 (e.g., via the inlet 112). In some embodiments, a single precursor gas source 102 is employed that includes a mixture of different gaseous precursor compounds. In other embodiments, a plurality of different precursor gases can be included in separate vessels and connected to the injection portion. Although the precursor gas source vessel 102 depicted in system 100 includes the precursor compound in the gas or vapor form, it should be appreciated that in various embodiments, the precursor compound can be provided in a vessel (e.g., vessel 102) in an aqueous form and converted to a gas via a vaporizer prior to injection into the internal reaction chamber 116.

In an aspect, inert gas of high purity is released into the internal reaction chamber 116 together with the gaseous precursors and also purged throughout the deposition process. For example, an inert gas (e.g., argon (Ar)) can be used as a carrier for the precursor vapors to facilitate their transport into the reaction chamber. In addition, the inert gas can be used to purge the entire system including the internal reaction chamber 116 and the delivery lines to prevent the possible contamination. The flow rate of the argon gas is controlled with mass flow meter. An inert gas source 108 can thus be included in the injection portion of system 100 with a gas valve 110 that controls the release of the inert gas into the internal reaction chamber 116 (e.g., via the inlet).

In accordance with the subject PCVD process, the precursor gas is released from the precursor gas vessel 102 into the internal reaction chamber 116 for a predetermined pulse duration. After the pulse injection period is complete, a pump-down or purge period is initiated wherein the un-reacted precursor gas and the inert gas are gradually released from the internal reaction chamber 116. The amount of precursor gas injected into the internal reaction chamber 116 is controlled by changing the pulse duration. The pulse injection cycle (and subsequent purge or pump-down) can be repeated a plurality of times based on the desired thickness of the resulting thin film formed on the substrate 120. Because the molecules of the vaporized precursor (in the gaseous state) are very small, they can diffuse into the internal reaction chamber 116 and fill the entire space of the internal reaction chamber around the substrate 120 independent of substrate geometry.

The gaseous precursors are chemically absorbed by the heated substrate surface with excellent adhesion. In addition, the surface-controlled reaction and growth allow the uniform film deposition free of surface defects such as pinholes. In some aspects, the precursor gas includes a mixed composition of two or more compounds. In other aspects, two or more precursor gas compounds can be separately injected (e.g., from separate vessels 102) into the internal reaction chamber with different pulse cycles. The oxidation reaction at the substrate surface is initiated by ignition of oxygen plasma. Consequently, high density conformal oxide films can be obtained at a higher deposition rate.

The exhaust portion includes an exhaust valve 124 that controls release of un-reacted/excess precursor gas and inert gas (e.g., outlet gas 126) from the internal reaction chamber 116 via a pump (not shown) in association with the purge or pump-down phase of the PCVD process. In some aspects, filter traps and/or precursor destruct traps (hot traps) are included in the exhaust portion of system 100 to receive the outlet gas 126 and prevent the discharge of byproducts into the environment. The inert gas is respectively purged into the external vacuum chamber 114 and the internal reaction chamber 116 by means of separate mass flow controllers. A metal cover (not shown) can be used to isolate the internal reaction chamber 116 and the external vacuum chamber 114. In addition to serving as a precursor gas carrier, inert gas can be employed to form a pressurized seal between the internal reaction chamber 116 and the external vacuum chamber. For example, via the injection of inert gas into the external vacuum chamber 114, the pressure in the external vacuum chamber 114 can be increased to about four times higher than that within the internal reaction chamber 116. As a result, no gaseous precursors are leaked from the internal reaction chamber 116 to the external vacuum chamber 114 during the deposition and purging processes. In addition, the inner wall of the external vacuum chamber 114 remains clean and free of deposited gaseous precursor particles.

System 100 can also include an operating device 104 to facilitate controlling various aspects of the PCVD process, including opening and closing of the various valves 106, 108 and 124, etc. in association with the pulse injection/deposition phase and the pump-down phase, and controlling the temperature and pressure of the internal reaction chamber.

In an example embodiment, the gaseous precursor(s) that is injected into the internal reaction chamber 116 (e.g., from the gaseous precursor source vessel 102) includes a metal organic compound. For example, the metal organic compound can include an aluminum containing organic compound (e.g., aluminum isopropoxide), and/or a titanium containing organic compound (e.g., titanium isopropoxide). To form a solid, homogenous and transparent protective coating on the substrate 120 including ionic oxide, the PCVD process is initiated by releasing a predetermined amount of one or more metal organic compounds from the gaseous precursor gas source 102 into internal reaction chamber 116 volume.

As noted above, the introduction of the metal organic compound gas precursor into the internal reaction chamber 116 is not carried out continuously, but in timed pulses followed by a pump-down period. During the injection phase of the process, the precursor gas source valve 106 is opened which releases a predetermined amount of the metal organic compound gas precursor from the high pressure precursor gas source vessel 102 into the low pressure internal reaction chamber 116 volume (which is at an initial reactor pressure $P_{min}$). The injection phase is typically very short (e.g., on the order of 0.1 second). The high pressure between the inlet 112 and the internal reaction chamber 116 volume means the precursor gas expands rapidly. After pulse injection period is finished (e.g., after a predetermined amount of time on the order of 0.1 second), precursor gas source valve 106 is closed and the internal reaction chamber 116 is at its maximum pressure of $P_{max}$.

During the pump-down period, the internal reaction chamber 116 is evacuated by a vacuum pump (not shown) while the exhaust valve 124 is in an open state. This pump-down process is longer than the injection phase (e.g., on the order of 40 seconds). This injection/pump-down cycle can be repeated a plurality of times throughout the deposition process, depending on the materials involved and the desired properties of the resultant thin film. For example, the thickness of the resultant film can be controlled based on the number of injection/pump-down cycles implemented. In an aspect, between about 100 and 300 cycles are employed to generate a film having a thickness between about 30 and 90 nm.

With conventional steady-state CVD processes, every step in the deposition process occurs simultaneously. However with the disclosed PCVD, these processes occur in series over each individual precursor gas injection pulse. Firstly the precursor gas (e.g., including one or more metal organic compounds) is introduced into the internal reaction chamber 116 and then it transported to the surface of the substrate 120 where it undergoes the deposition reaction. The reaction byproducts are then transported away from the substrate surface. Although these individual processes may overlap, they do not happen simultaneously over the entire length of the pulse injection/pump-down cycle. A consequence of this unique operating regime is that the process gases tend to be in a continuous state of overall expansion within the reactor 116. First the gases expand rapidly as a jet from the precursor gas source valve 106 during the injection phase, and then more slowly as the internal reaction chamber 116 is evacuated by the vacuum pump. This unique regime has been shown to result in highly uniform and dense film formation, even on substrates with complex and non-planar surface topologies.

In association with formation of the subject transparent and homogenous coating on various substrate surfaces using the above described PCVD process, the precursor gas includes one or more metal organic compounds that contain metal and organic ligands. These types of metal organic compounds are volatile but thermally stable. For example, in an exemplary embodiment, the precursor gas source 102 can include an aluminum containing organic compound (e.g., aluminum isopropoxide) or a titanium containing organic compound (e.g., titanium isopropoxide). The right selection of precursors for the PCVD process is important to obtain the desired thin film/coating material. In another example, the metal organic precursors can include but are not limited to: metal hydrides, metal alkoxides, metal alkyls, metal diketonites, metal amidinates, metal carbonyls and the like. For multi-component layer deposition, separate precursor solutions can be used that respectively include different metal organic compounds, or several metal organic compound precursors can be dissolved in an appropriate molar ratio in a single solution. Once all the heated systems reach the set temperature in the deposition process, the substrate is exposed to reactant pulses. As noted supra, the injection/pump-down cycles are repeated a predetermined number of times to achieve deposition of desired thickness.

In general, transparent materials possess band gaps with energies corresponding to wavelengths which are shorter than the visible range (e.g., 380-750 nm, or a photon energy of 1.6-3.3 eV). Ionic oxides are usually optically transparent and chemically inert due to their large band gaps between the occupied and unoccupied states. For instance, amorphous alumina ($Al_2O_3$) is hard and stable up to high temperatures. Also, it has the largest band gap (~8.7 eV) next to quartz ($SiO_2$). Therefore, $Al_2O_3$ is a promising material for surface passivation and protection. Other oxide films such as magnesium oxide (MgO) have band gaps of 7.4-7.8 eV. For these large band gap materials, there is very little optical absorption over most or all the visible range. Titanium dioxide ($TiO_2$) films have been reported to be optical transparent and corrosive resistant. In accordance with various implementations, homogenous $Al_2O_3$ and/or $TiO_2$ thin films as well as their derivatives (e.g., composites and nano-laminates) are synthesized onto the surface of the substrate 114 using system 100 using the disclosed metal organic compounds as the precursor gas source 102. In an aspect, one or more metal organic compound gaseous precursors can be used in the PCVD process. The metal organic precursors are sufficiently volatile for transfer under vacuum with inert high-purity carrier gas (e.g., argon gas). In addition, argon gas can be used to purge the entire system including the reaction chamber and the delivery lines to prevent the possible contamination. The flow rate of the argon gas is controlled with mass flow controller.

The substrate 120 upon which the coating is deposited can vary. In one or more embodiments, a surface of the substrate includes a precious metal (e.g., gold, silver, platinum, palladium, and alloys thereof), copper, and/or a copper alloy. In other embodiments, the surface material of the substrate can include one or more other metals, metal alloys, or metal compounds, including but not limited to: aluminum, titanium, chromium, iron, cobalt, nickel, zirconium, niobium, molybdenum, tantalum, and tungsten, etc. Still in other embodiments, the surface material of the substrate 120 can include other non-metal elements or compounds such as glass and ceramics.

In some aspects, prior to formation of the ionic oxide films on the substrate surface within the internal reaction chamber 116, the substrate can be prepped and subjected to interfacial pre-treatment to facilitate film-to-substrate adhesion. For example, substrate heating for outgassing can be employed and/or substrate cleaning/etching in vacuum with Ar plasma can be employed. In some aspects, the substrate 120 can be ultrasonically cleaned to remove grease, dirt, or other contaminants before placement into the reaction chamber.

As noted above, a variety of PCVD processing control parameters can be tailored to control the characteristics (e.g., thickness, uniformity, density, opacity, strength, etc.) of the resulting thin film formed on the substrate surface. For example, these factors can include but are not limited to: reactor/substrate temperature, reactor pressure, mass flow/supply rate, supply pressure, precursor gas concentration, (can determine microstructure of resulting solid film), duration of the injection phase (e.g., 0.1 seconds to 4.0 seconds), duration of the pump-down phase (e.g., about 30 seconds to about 2 minutes), number of repeated cycles, reactor size (e.g., length and diameter), injection orifice area, and high pressure precursor gas source vessel 102 size.

The temperature of the PCVD process can vary, however, a relatively low temperature is preferred (compared to conventional CVD). Conventional in one embodiment, the temperature is less than 500° C. In other embodiments, the temperature is less than 400° C. In another embodiment, the temperature is between about 100° C. and 300° C. Still in yet another embodiment, the temperature is between about 80° C. and 300° C.

The precursor(s) is introduced into the internal reaction chamber 116 by pulse injection of the precursor(s) in a gaseous or vaporized state. The mass transport of the gas/vapor precursor into the reactor chamber 116 can be enhanced by increasing the pressure gradient between the high pressure source vessel and the reactor chamber 116. The amount of precursor gas/vapor injected into the reactor chamber 116 is controlled by changing the duration of the pulse time. This cycle can be repeated as many times as desired to grow thicker films. In one embodiment, the nominal base pressure of the internal reaction chamber 116 prior to injection of the precursor gas/vapor is evacuated to about 0.5 Pa. The maximum pressure inside the reactor chamber of the precursor gas/vapor during the pulse injection period is about 100 Pa, and the pressure of the purge gas in the reactor chamber 116 during the pump-down period is about 50 Pa. In various embodiments, the duration of the injection period is about 0.1 to about 1.0 seconds, and the duration of the pump-down period between each pulse is about 40.0 to about 100 seconds. The substrate temperature for coating deposition is typically heated to between about 100 and 300° C., and preferably heated to about 200° C.

In various embodiments, the internal reaction chamber 116 is specially designed with a shape/geometry for coating 3D objects to ensure the homogenous distribution of the precursors to form a conformal coating on the 3D objects. For example, in an exemplary embodiment, the internal reaction chamber 116 has a diameter of about 500 mm and a height of about 500 mm. During the deposition and purging process, no precursor gas/vapor is leaked from the internal reaction chamber 116 to the external vacuum chamber 114 due to the sealing inert gas. Both the external vacuum chamber 114 and internal reaction chamber 116 can be evacuated to a base pressure of about 0.5 Pa. There is a metal cover (not shown) in front of the internal reaction chamber 116. The inert gas (e.g., Ar) is introduced respectively into the internal chamber as carrier gas, as well as to the external vacuum chamber 114 as sealing gas, by means of separate mass flow controllers. By adjusting the flow rate, the pressure in the external vacuum chamber is about 2 to 4 times higher than that in the internal reaction chamber 116. As a result, the chemical reaction only takes place within the internal reaction chamber 116. As the whole internal reaction chamber 116 is under a vacuum sealed condition (inside the external vacuum chamber), the heat dissipation is very limited. With the combined internal reaction chamber 116 and external vacuum chamber 114 design, the external vacuum chamber 114 remains clean and the temperature distribution within the internal reaction chamber is homogeneous. In addition, the internal reaction chamber 116 is replaceable after using for a period of time.

In an aspect, based on precise selection and control of one or more of the factors noted above, the resulting coating or thin film formed on the substrate 120 surface has a thickness less than 80 nanometers (nm) and the coating is optically transparent in the visible light wavelength. In another embodiment, the resulting thickness of the coating or thin film is between about 10.0 nm and about 100 nm.

Figure 2:
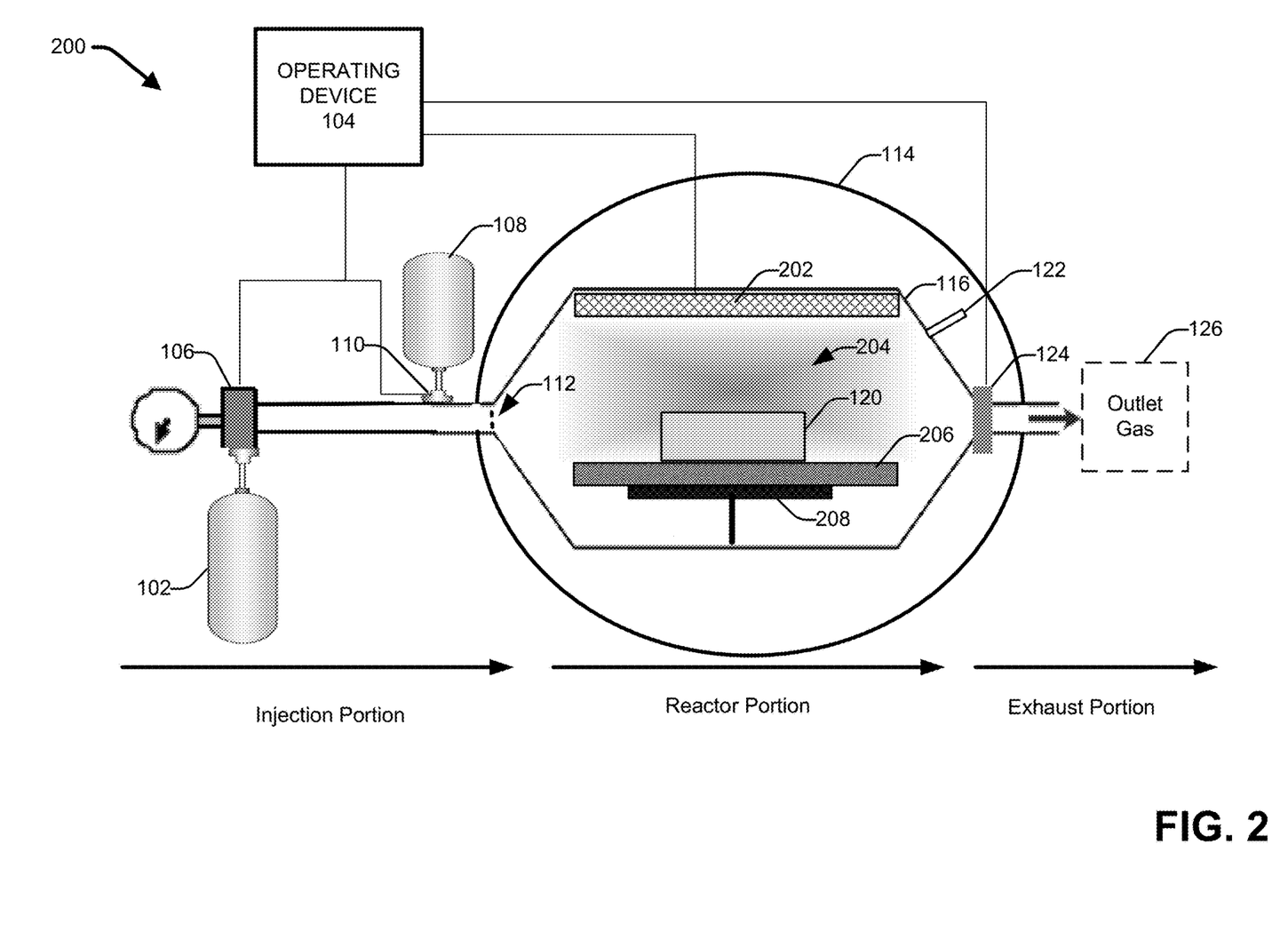
FIG. 2 presents an example plasma enhanced pulsed chemical vapor deposition (PE-PCVD) system for applying a homogeneous and transparent protective coating on 3D metal objects in accordance with various aspects and embodiments described herein.

FIG. 2 presents an example PE-PCVD system 200 for applying a homogeneous and transparent protective coating on metal objects in accordance with various aspects and embodiments described herein. System 200 includes same or similar features and functionality as system 100 with the adaptation of the reactor portion to provide for PE-PCVD as opposed to PCVD. Repetitive description of like elements employed in respective embodiments described herein is omitted for sake of brevity.

System 200 combines the elements of PCVD, described with respect to system 100, with those of traditional PECVD. As described supra, PE-PCVD utilizes plasma to enhance chemical reaction rates of CVD precursor. With PE-PCVD, the gas precursors (which in accordance with the subject embodiments include metal organic compounds), are converted to a plasma 204 and the chemical reaction between the precursors and the substrate 120 surface occur after creation of the plasma 204.

In an aspect, as depicted in system 200, the plasma 204 is created by RF (radio-frequency, 13.56 MHz) discharge between two electrodes 202 and 206 located within the internal reaction chamber 116. In some embodiments, the RF power can be supplied/applied to the electrodes (e.g., electrode 202 directly and electrode 206 indirectly), via the operating device 104. In other embodiments, the RF power can be provided by another device or power source attached to the system 200. The space between the two electrodes 202 and 206 is filled with the reacting gases which are converted to plasma 204 prior to reaction with the surface of the substrate 120. In an aspect, the substrate 120 is also heated (e.g., to about 100 to 300° C.) via a heating plate 208 located within the internal reaction chamber 116 and upon which the substrate 120 is placed. PE-PCVD processing allows for thin film deposition at lower temperatures and increased reactivity than conventional CVD.

Figure 3:
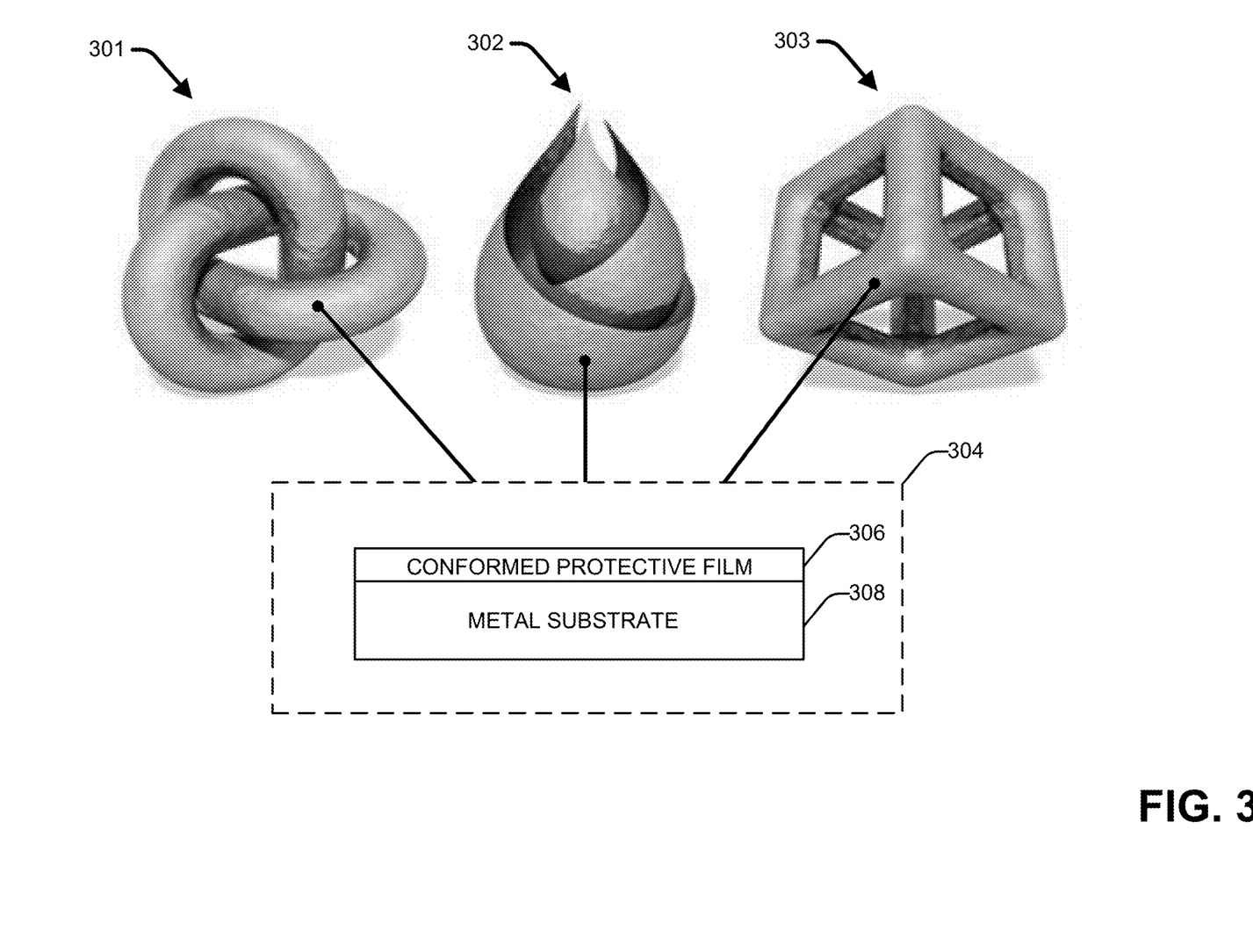
FIG. 3 presents example 3D metal objects with non-planar topographies and having a homogeneous and transparent protective film formed on a surface thereon in accordance with various aspects and embodiments described herein.

FIG. 3 presents example three-dimensional metal objects 301, 302 and 303 with non-planar topographies and having a homogeneous and transparent protective film formed on a surface thereon in accordance with various aspects and embodiments described herein. Repetitive description of like elements employed in respective embodiments described herein is omitted for sake of brevity.

As described supra, the subject coatings can be formed on a variety of different objects to provide surface protection (e.g., against scratching, corrosion, discoloration, oxidation, etc.) and/or to enhance the appearance and luster of the objects. For example, the subject coatings can be formed on various objects with surfaces including a precious metal and/or copper alloy, such as watches, jewelry, trinkets, souvenirs, coins, etc. The subject coatings can also be formed on other products to improve the durability thereof, such as device displays and implantable medical devices. Still in yet other aspects, the disclosed coatings can be applied to other objects/products for surface passivation.

In an exemplary embodiment, example objects 301, 302 and 303 include a conformed protective film 306 formed thereon via PCVD and/or PE-PCVD in accordance with the aspects and embodiments described with reference to systems 100 and 200. It should be appreciated that the size, shape and geometry of objects 301, 302 and 303 is merely exemplary. Call out box 304 depicts an enlarged cross-section of a surface of the respective objects. As shown in call out box 304, the respective objects include a metal substrate 308 (e.g., including a precious metal and/or a copper alloy) with a conformed protective film 306 formed thereon. The protective film 306 includes a solid form of ionic oxide, including but not limited to: aluminum oxide, titanium oxide, a compound comprising aluminum oxide, or a compound comprising titanium oxide. In one implementation, the protective film 306 includes a single layer of ionic oxide material. In other implementations, the protective film can include a plurality of layer of ionic oxide material (e.g., including one or more of the ionic oxide materials listed above).

Due to the nature of the PCVD and/or PE-PCVD process via which the protective film 306 was formed, the thickness of the protective film is substantially uniform over the entire surfaces of the respective objects, despite their complex and non-planar three-dimensional surface topology. In an aspect, the thickness of the protective film is about 10 nm to about 100 nm. The protective film 306 is further optically transparent.

Figure 4:
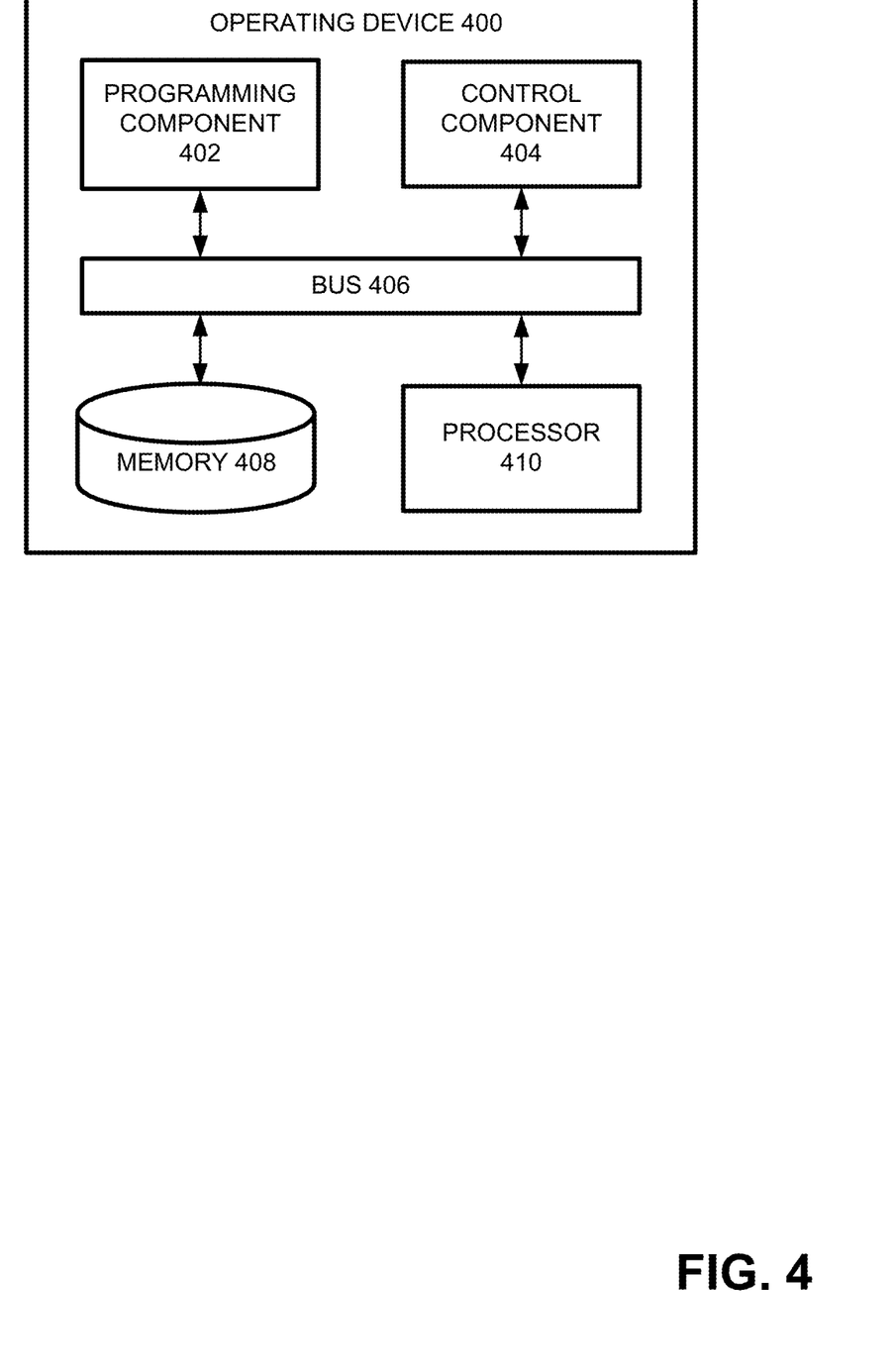
FIG. 4 presents an example system for applying a homogeneous and transparent protective coating on the surfaces of 3D metal objects in accordance with various aspects and embodiments described herein.

FIG. 4 presents an example operating device 400 for controlling application of a homogeneous and transparent protective coating on the surfaces of various products using PCVD and/or PE-PCVD in accordance with various aspects and embodiments described herein. Operating device 400 can include same or similar features and functionalities as operating device 104. Repetitive description of like elements employed in respective embodiments described herein is omitted for sake of brevity.

Aspects of systems, apparatuses or processes explained in this disclosure can constitute machine-executable components embodied within machine(s), e.g., embodied in one or more computer readable mediums (or media) associated with one or more machines. Such components, when executed by the one or more machines, e.g., computer(s), computing device(s), virtual machine(s), etc. can cause the machine(s) to perform the operations described.

Operating device 400 includes a programming component 402 and a control component 404. Programming component 402 is configured to program one or more operating parameters of a PCVD or PE-PCVD system (e.g., system 100 and 200) in accordance with aspects and embodiments described herein. In particular, the properties of a desired surface film or coating (e.g., thickness, density, uniformity, etc.) can be achieved and controlled by careful selection of a set of PCVD operating parameters based on the substrate surface material, the substrate surface topology, the substrate size, the reactor size, and the type of gaseous precursors employed. These parameters can include but are not limited to: reactor temperature, reactor processing pressure, reaction supply rate, high pressure gaseous precursor gas source vessel 102 pressure, gaseous precursor concentration (e.g., in vessel 102 and the internal reaction chamber 116), duration of injection, duration of pump-down, and number of pulse cycles.

Control component 404 is configured to implement the programmed operating parameters and control the operation of the PCVD and/or PE-PCVD system according to the operating parameters. For example, control component 404 can control the reactor temperature, the reactor processing pressure, the reaction supply rate, the high pressure gaseous precursor gas source vessel 102 pressure, the gaseous precursor concentration (e.g., in vessel 102 and the reactor 116), the duration of injection (e.g., via opening and closing of valves, 106, 108 and 124), duration of pump-down, and number of pulse cycles.

Operating device 400 further includes memory 408 to store computer executable components, and processor 410 that executes the computer executable components stored in the memory (e.g., programming component 402 and control component 404). Operating device 400 also includes a system bus 406 that couples the various components including, but not limited to, programming component 402, control component 404, memory, processor 410 and the various components of the PCVD and/or PE-PCVD system.

In view of the example systems and/or devices described herein, example methods that can be implemented in accordance with the disclosed subject matter can be further appreciated with reference to flowcharts in FIGS. 5-8. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

Figure 5:
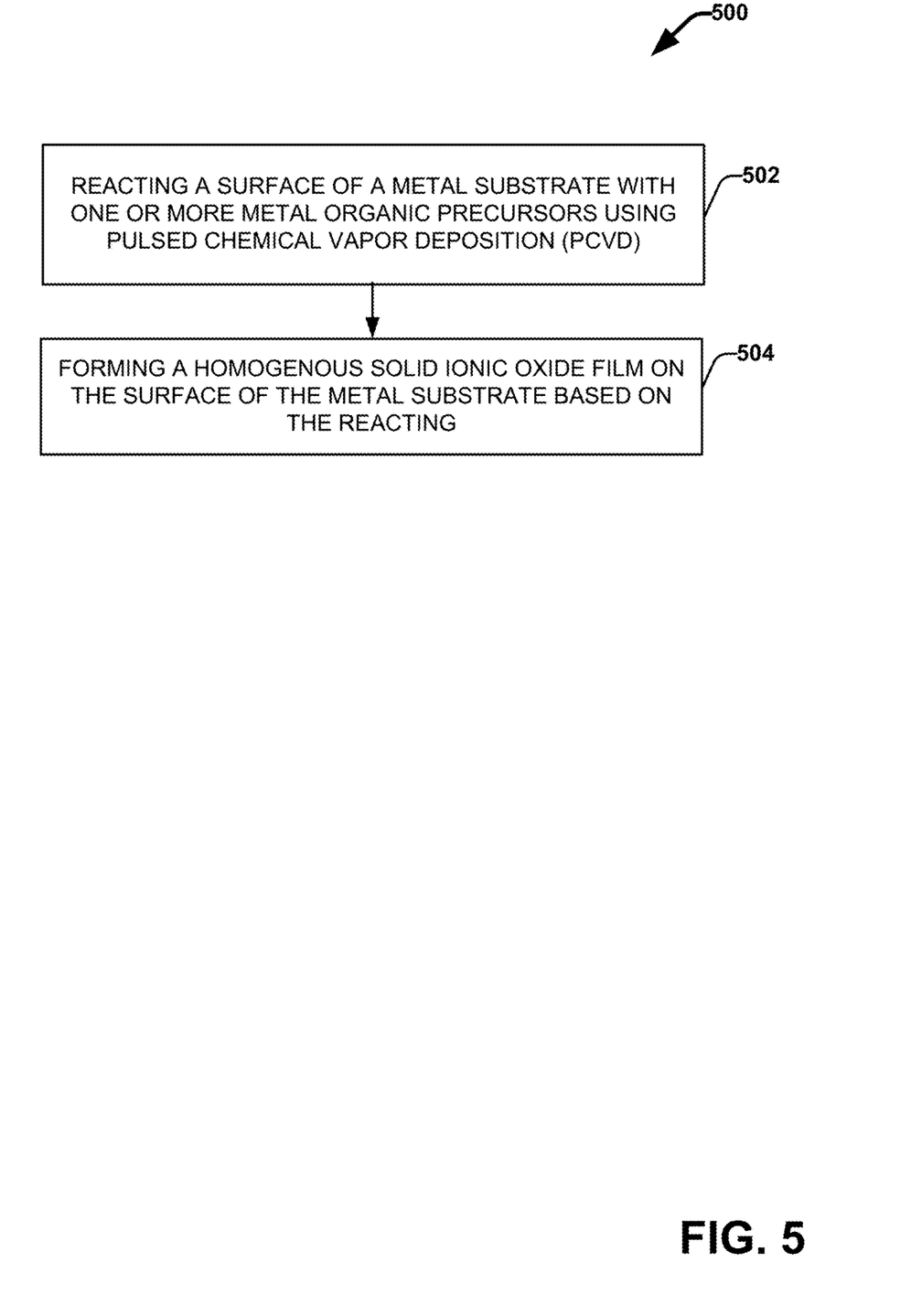
FIG. 5 presents an example method for applying a homogeneous and transparent protective coating on the surfaces of 3D metal objects in accordance with various aspects and embodiments described herein.

FIG. 5 presents an example method for applying a homogeneous and transparent protective coating on the surfaces of metal objects in accordance with various aspects and embodiments described herein. At 502, a surface of a metal substrate is reacted with one or more metal organic precursors (e.g., in a gas or vapor form) using PCVD (e.g., via system 100). At 504, a homogenous and transparent solid ionic oxide film is formed on the surface of the metal substrate based on the reacting.

Figure 6:
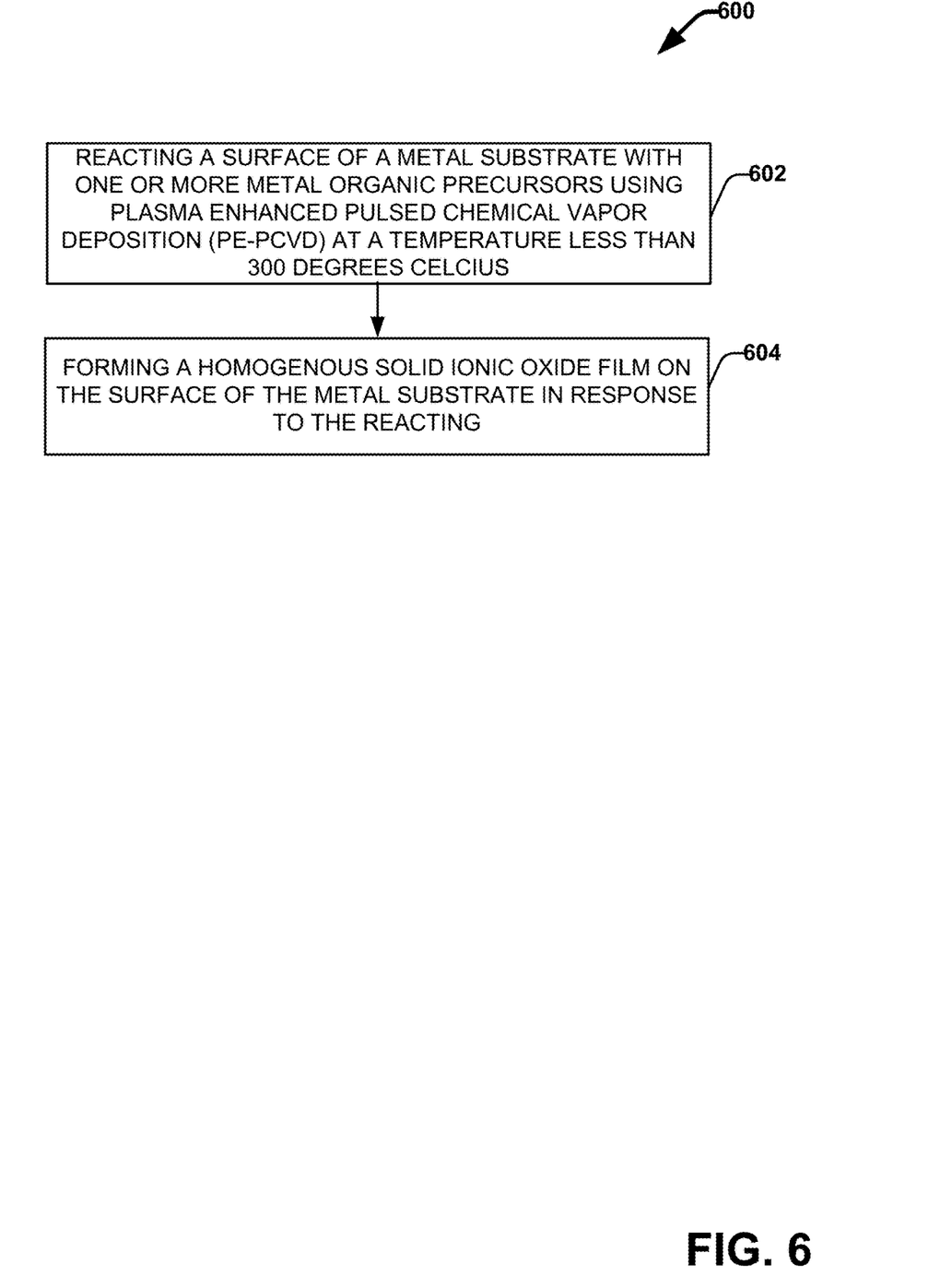
FIG. 6 presents another example method for applying a homogeneous and transparent protective coating on the surfaces of 3D metal objects in accordance with various aspects and embodiments described herein.

FIG. 6 presents another example method for applying a homogeneous and transparent protective coating on the surfaces of metal objects in accordance with various aspects and embodiments described herein. At 602, a surface of a metal substrate is reacted with one or more metal organic precursors (e.g., in a gas or vapor form) using PE-PCVD (e.g., via system 200) at a temperature less than 300° C. using PE-PCVD. At 604, a homogenous and transparent solid ionic oxide film is formed on the surface of the metal substrate in response to the reacting.

Figure 7:
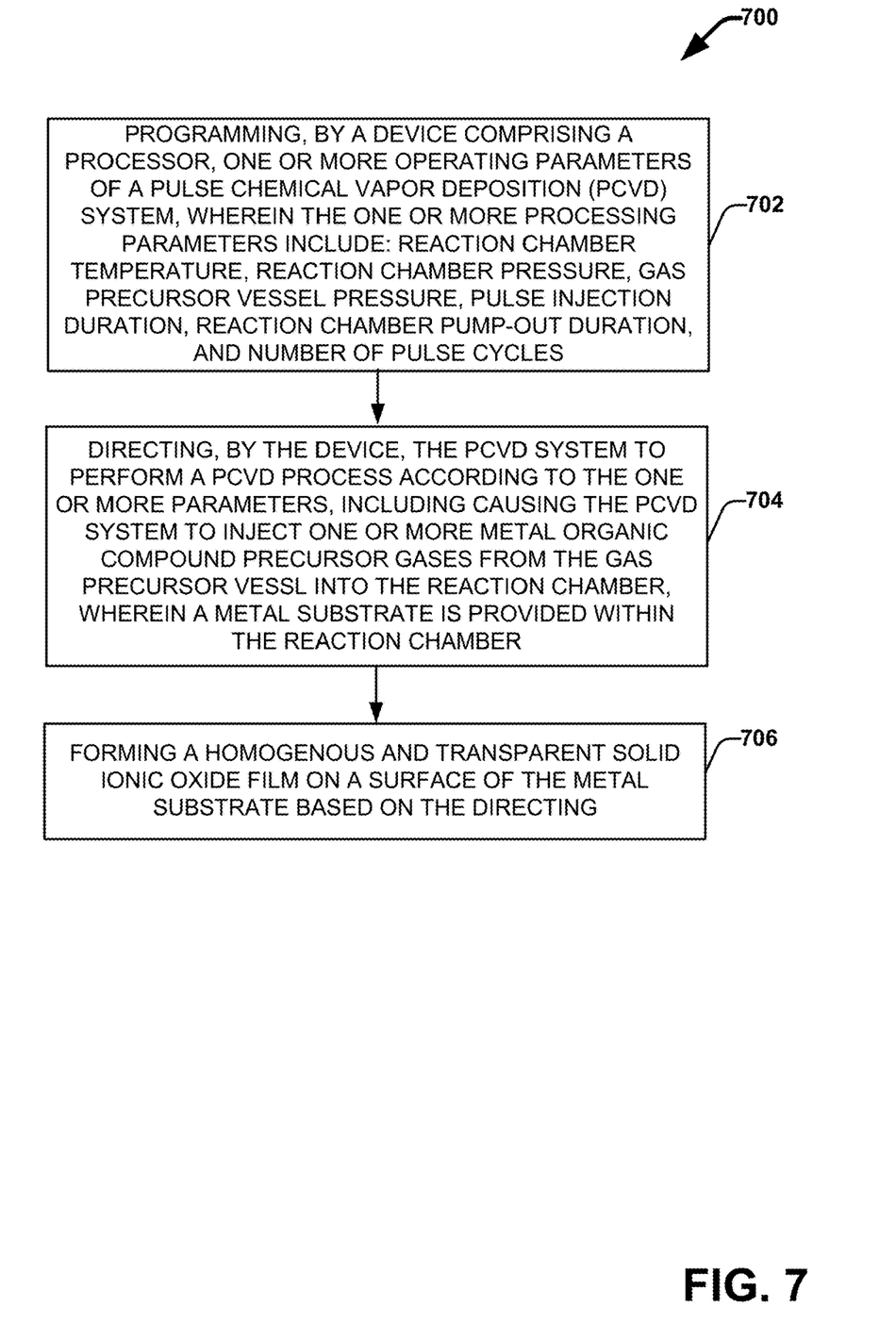
FIG. 7 presents another example method for applying a homogeneous and transparent protective coating on the surfaces of 3D metal objects in accordance with various aspects and embodiments described herein.

FIG. 7 presents another example method for applying a homogeneous and transparent protective coating on the surfaces of metal objects in accordance with various aspects and embodiments described herein. At 702, a device comprising a processor, (e.g., operating device 104 and/or operating device 400) programs one or more operating parameter of a PCVD system (e.g., system 100, or PE-PCVD system 200). These operating parameters can include but are not limited to: reactor temperatures, reactor pressure, gas precursor vessel (e.g., vessel 102) pressure, pulse injection duration, reactor pump-out duration, and number of pulse cycles. In an aspect, the parameters are carefully selected based on the surface material of the substrate, the geometry/size of the substrate, the desired thickness of the resulting film, and the precursor gas material.

At 704, the device then directs the PCVD system to perform a PCVD process according to the one or more parameters, including causing the PCVD system to inject one or more metal organic compound precursor gases from the gas precursor vessel into the reaction chamber, wherein a metal substrate is provided within the reaction chamber. Then at 706, a homogenous and transparent solid ionic oxide film is formed on the surface of the metal substrate based on the directing.

Figure 8:
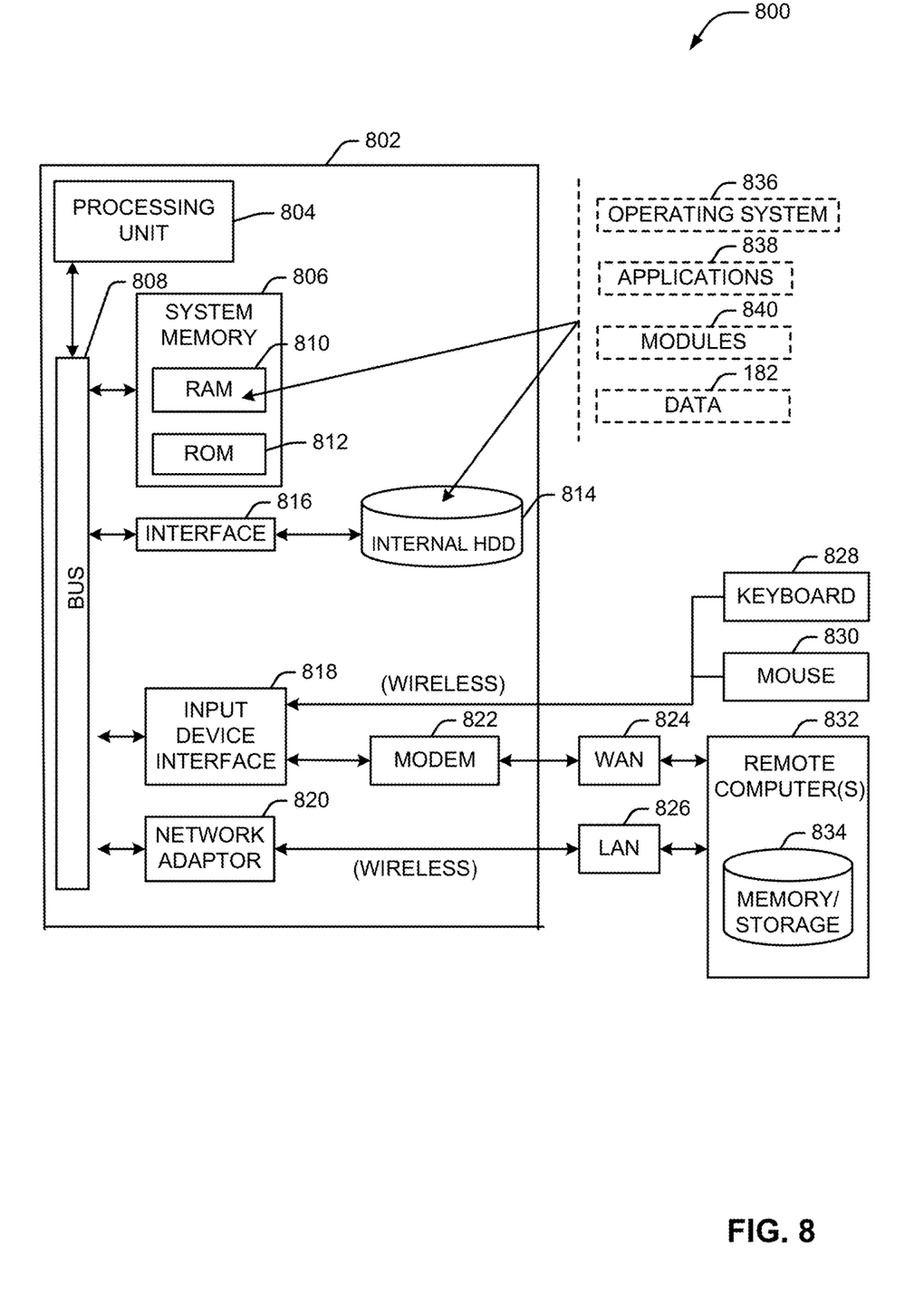
FIG. 8 illustrates a block diagram of a computer operable to facilitate telemetry with an implantable device based on vibration of an external device in accordance with one or more embodiments described herein.

FIG. 8 illustrates a block diagram of a computer operable to facilitate various aspects of the disclosed processes for applying a homogenous and transparent protective coating onto metal objects in accordance with one or more of the embodiments disclosed herein. In order to provide additional context for these embodiments, FIG. 8 and the following discussion are intended to provide a brief, general description of a suitable computing environment 800 in which the one or more embodiments described herein can be implemented.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data or unstructured data. Tangible and/or non-transitory computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage, other magnetic storage devices and/or other media that can be used to store desired information. Computer-readable storage media can be accessed by one or more local or remote computing devices, e.g., via access requests, queries or other data retrieval protocols, for a variety of operations with respect to the information stored by the medium.

In this regard, the term "tangible" herein as applied to storage, memory, computer-readable media or computer-readable storage media, is to be understood to exclude only propagating intangible signals per se as a modifier and does not relinquish coverage of all standard storage, memory, computer-readable media or computer-readable storage media that are not only propagating intangible signals per se.

In this regard, the term "non-transitory" herein as applied to storage, memory, computer-readable media or computer-readable storage media, is to be understood to exclude only propagating transitory signals per se as a modifier and does not relinquish coverage of all standard storage, memory, computer-readable media or computer-readable storage media that are not only propagating transitory signals per se.

Communications media typically embody computer-readable instructions, data structures, program modules or other structured or unstructured data in a data signal such as a modulated data signal, e.g., a channel wave or other transport mechanism, and includes any information delivery or transport media. The term "modulated data signal" or signals refers to a signal that has one or more of the data signal's characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 8, example environment 800 for implementing one or more embodiments of the embodiments described herein includes computer 802, computer 802 including processing unit 804, system memory 806 and system bus 808. System bus 808 couples system components including, but not limited to, system memory 806 to processing unit 804. Processing unit 804 can be any of various commercially available processors. Dual microprocessors and other multi-processor architectures can also be employed as processing unit 804.

System bus 808 can be any of several types of bus structure that can further interconnect to a memory bus (with or without a memory controller), a peripheral bus, and a local bus using any of a variety of commercially available bus architectures. System memory 806 includes RAM 810 and ROM 812. A basic input/output system (BIOS) can be stored in a non-volatile memory such as ROM, erasable programmable read only memory (EPROM), EEPROM, which BIOS contains the basic routines that help to transfer information between elements within computer 802, such as during startup. RAM 810 can also include a high-speed RAM such as static RAM for caching data.

Computer 802 further includes internal hard disk drive (HDD) 814 (e.g., Enhanced Integrated Drive Electronics (EIDE), Serial Advanced Technology Attachment (SATA)). HDD 814 can be connected to system bus 808 by hard disk drive interface 816. The drives and their associated computer-readable storage media provide nonvolatile storage of data, data structures, computer-executable instructions, and so forth. For computer 802, the drives and storage media accommodate the storage of any data in a suitable digital format.

A number of program modules can be stored in the drives and RAM 810, including operating system 836, one or more application programs 838, other program modules 840 and program data 842. All or portions of the operating system, applications, modules, and/or data can also be cached in RAM 810. The systems and methods described herein can be implemented utilizing various commercially available operating systems or combinations of operating systems.

A mobile device can enter commands and information into computer 802 through one or more wireless input devices, e.g., wireless keyboard 828 and a pointing device, such as wireless mouse 830. Other input devices (not shown) can include a smart phone, tablet, laptop, wand, wearable device or the like. These and other input devices are often connected to the processing unit 804 through input device interface 818 that can be coupled to system bus 808, but can be connected by other interfaces, such as a parallel port, an IEEE serial port, a game port and/or a universal serial bus (USB) port.

Computer 802 can operate in a networked environment using logical connections via wired and/or wireless communications to one or more remote computers, such as remote computer(s) 832. Remote computer(s) 832 can be a workstation, a server computer, a router, a personal computer, portable computer, microprocessor-based entertainment appliance, a peer device or other common network node, and typically includes many or all of the elements described relative to computer 802, although, for purposes of brevity, only memory/storage device 834 is illustrated. The logical connections depicted include wired/wireless connectivity to a local area network (LAN) 826 and/or larger networks, e.g., WAN 824, as well as smaller PANs involving a few devices (e.g., at least two). LAN and WAN networking environments are commonplace in the home, offices (e.g., medical facility offices, hospital offices) and companies, and facilitate enterprise-wide computer networks, such as intranets, all of which can connect to a global communications network (e.g., the Internet).

When used in a LAN networking environment, computer 802 can be connected to local network through a wired and/or wireless communication network interface or adapter 820. Adapter 820 can facilitate wired or wireless communication to LAN 826, which can also include a wireless access point (AP) connected to the LAN 826 for communicating with adapter 820.

When used in a WAN networking environment, computer 802 can include modem 822 or can be connected to a communications server on WAN 824 or has other means for establishing communications over WAN 824, such as by way of the Internet. Modem 822, which can be internal or external and a wired or wireless device, can be connected to system bus 808 via input device interface 816. In a networked environment, program modules depicted relative to computer 802 or portions thereof, can be stored in a remote memory/storage device. It will be appreciated that the network connections shown are example and other means of establishing a communications link between the computers can be used.

Computer 802 can be operable to communicate with any wireless devices or entities operatively disposed in wireless communication via any number of protocols, including, but not limited to, NFC, Wi-Fi and/or BLUETOOTH® wireless protocols. Thus, the communication can be a defined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out. Wi-Fi networks use radio technologies called IEEE 802.8 (a, b, g, n, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands, at an 8 Mbps (802.8a) or 54 Mbps (802.8b) data rate, for example or with products that contain both bands (dual band), so the networks can provide real-world performance similar to the basic 10BaseT wired Ethernet networks used in many offices.

The embodiments of devices described herein can employ artificial intelligence (AI) to facilitate automating one or more features described herein. The embodiments (e.g., in connection with automatically identifying acquired cell sites that provide a maximum value/benefit after addition to an existing communication network) can employ various AI-based schemes for carrying out one or more embodiments thereof. Moreover, the classifier can be employed to determine a ranking or priority of each cell site of an acquired network. A classifier is a function that maps an input attribute vector, $x=(x1, x2, x3, x4, \ldots, xn)$, to a confidence that the input belongs to a class, that is, $f(x)=$confidence (class). Such classification can employ a probabilistic and/or statistical-based analysis (e.g., factoring into the analysis utilities and costs) to prognose or infer an action that a mobile device desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing mobile device behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As employed herein, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of mobile device equipment. A processor can also be implemented as a combination of computing processing units.

Memory disclosed herein can include volatile memory or nonvolatile memory or can include both volatile and nonvolatile memory. By way of illustration, and not limitation, nonvolatile memory can include ROM, programmable ROM (PROM), electrically programmable ROM (EPROM), electrically erasable PROM (EEPROM) or flash memory. Volatile memory can include RAM, which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data storages, databases) of the embodiments is intended to include, without being limited to, these and any other suitable types of memory.

As used herein, terms such as "data storage," "database," and substantially any other information storage component relevant to operation and functionality of a component, refer to "memory components," or entities embodied in a "memory" or components including the memory. It will be appreciated that the memory components or computer-readable storage media, described herein can be either volatile memory or nonvolatile memory or can include both volatile and nonvolatile memory.

What has been described above includes mere examples of one or more embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject embodiments may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. An object, comprising:
 a three-dimensional geometrical shape comprising a non-planar surface topology and dimensions less than 500.0 millimeters (mm) in diameter and 500.00 mm in height;
 a metal surface comprising gold that covers the non-planar surface topology, wherein the object has been subjected to pulsed chemical vapor deposition (PCVD) inside a vacuum sealed reaction chamber having dimensions of about 500.0 mm in diameter and 500.0 mm in height and comprising an injection valve and an exhaust valve, wherein the PCVD comprises a plurality of cycles, wherein each cycle of the plurality of cycles is the same, and wherein each cycle comprises injecting a metal organic gaseous precursor comprising metal and organic ligands into the vacuum sealed reaction chamber when the vacuum sealed reaction chamber is under a minimum internal pressure state for a pulsed duration via the injection valve with the object is inside the vacuum sealed reaction chamber, sealing the injection valve after the pulse duration and achieving a maximum internal pressure state of the vacuum sealed reaction chamber, opening the exhaust valve, and evacuating unreacted portions of the metal organic gaseous precursor from the vacuum sealed reaction chamber via the exhaust valve for a pump-down period, wherein the pulse duration is about 1.0 second and the pump-down period is about 40 seconds; and
 a transparent coating formed on the metal surface as a result of the PCVD, wherein, based on formation of the transparent coating by the PCVD, the transparent coating comprises one or more homogeneous layers of ionic oxide that are free of defects including pinholes, wherein the transparent coating has a uniform or substantially uniform thickness less than 80 nanometers, and wherein the transparent coating prevents corrosion of the metal surface, wherein the transparent coating does not change a karatage value of the object after melting, wherein the one or more homogeneous layers are free of surface defects including pinholes.

2. The object of claim 1, wherein the transparent coating further prevents oxidation of the metal surface.

3. The object of claim 1, wherein the one or more homogeneous layers of ionic oxide comprise at least one of: aluminum oxide, titanium oxide, a compound comprising aluminum oxide, or a compound comprising titanium oxide.

4. The object of claim 1, wherein the transparent coating further prevents discoloration of the metal surface.

5. The object of claim 1, wherein the PCVD was performed at a temperature between about 100-300° C.

6. The object of claim 1, wherein the metal surface further comprises copper, a copper alloy, platinum or palladium.

7. The object of claim 1, wherein the transparent coating further prevents the metal surface against chemical substance induced oxidation, corrosion and discoloration.

8. The object of claim 1, wherein the metal surface further comprises silver.

9. The object of claim 1, wherein the metal organic gaseous precursor, the pulse duration, and the pump-down period are the same for each cycle.

10. The object of claim 1, wherein the object is a piece of jewelry comprising the metal surface.

11. An object, comprising:
a three-dimensional geometrical shape comprising a non-planar surface topology and dimensions less than 500.0 millimeters (mm) in diameter and 500.00 mm in height;
a metal surface comprising gold and copper or a copper alloy that covers the non-planar surface topology, wherein the object has been subjected to pulsed chemical vapor deposition (PCVD) inside a vacuum sealed reaction chamber having dimensions of about 500.0 mm in diameter and 500.0 mm in height and comprising an injection valve and an exhaust valve, wherein the PCVD comprises a plurality of cycles, wherein each cycle is of the plurality of cycles is a same cycle, and wherein each cycle comprises injecting two or more combined metal organic gaseous precursors comprising metal and organic ligands into the vacuum sealed reaction chamber when the vacuum sealed reaction chamber is under a minimum internal pressure state for a pulsed duration via the injection valve with the object inside the vacuum sealed reaction chamber, sealing the injection valve after the pulse duration and achieving a maximum internal pressure state of the vacuum sealed reaction chamber, opening the exhaust valve, and removing unreacted portions of the two or more combined metal organic gaseous precursors from the vacuum sealed reaction chamber via the exhaust valve for a pump-down period, wherein the pulse duration is about 1.0 second and the pump-down period is about 40 seconds; and
a transparent coating formed on the metal surface as a result of the PCVD, wherein, based on formation of the transparent coating by the PCVD, the transparent coating comprises one or more homogeneous layers of ionic oxide, has a uniform thickness less than 80 nanometers, and prevents the metal surface from corrosion and discoloration in association with exposure of the object to a chemical substance,
wherein the transparent coating does not change a karatage value of the object after melting,
wherein the one or more homogeneous layers are free of surface defects including pinholes.

12. The object of claim 11, wherein the chemical substance comprises sweat.

13. An object, comprising:
a three-dimensional geometrical shape comprising a non-planar surface topology and dimensions less than 500.0 millimeters (mm) in diameter and 500.00 mm in height, and wherein the object comprises an article of jewelry;
a metal surface comprising gold and copper or a copper alloy that covers the non-planar surface topology, wherein the object has been subjected to pulsed chemical vapor deposition (PCVD) inside a vacuum sealed reaction chamber having dimensions of about 500.0 mm in diameter and 500.0 mm in height and comprising an injection valve and an exhaust valve, wherein the PCVD comprises a plurality of cycles, wherein each cycle of the plurality of cycles is the same, and wherein each cycle comprises injecting a metal organic gaseous precursor comprising metal and organic ligands into the vacuum sealed reaction chamber when the vacuum sealed reaction chamber is under a minimum internal pressure state for a pulsed duration via the injection valve with the object is inside the vacuum sealed reaction chamber, sealing the injection valve after the pulse duration and achieving a maximum internal pressure state of the vacuum sealed reaction chamber, opening the exhaust valve, and evacuating unreacted portions of the metal organic gaseous precursor from the vacuum sealed reaction chamber via the exhaust valve for a pump-down period, wherein the pulse duration is about 1.0 second and the pump-down period is about 40 seconds, and wherein each cycle further comprises injecting an inert gas with the metal organic gaseous precursor via the injection valve; and
a transparent coating formed on the metal surface as a result of the PCVD, wherein based on formation of the transparent coating by the PCVD, the transparent coating comprises one or more homogeneous layers of ionic oxide, has a substantially uniform thickness less than 80 nanometers, and prevents the metal surface from corrosion and discoloration in association with exposure of the object to a chemical substance,
wherein the transparent coating does not change a karatage value of the object after melting,
wherein the one or more homogeneous layers are free of surface defects including pinholes as a result of the PCVD.

14. The object of claim 9, wherein the plurality of cycles comprises between about 100 cycles and 500 cycles.

15. The object of claim 9, wherein each cycle further comprises injecting an inert gas with the metal organic gaseous precursor via the injection valve.

* * * * *